United States Patent
Kim

(10) Patent No.: US 8,106,694 B2
(45) Date of Patent: Jan. 31, 2012

(54) DLL CIRCUIT

(75) Inventor: Tae Kyun Kim, Ichon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/113,744

(22) Filed: May 23, 2011

(65) Prior Publication Data

US 2011/0221496 A1   Sep. 15, 2011

Related U.S. Application Data

(62) Division of application No. 12/431,875, filed on Apr. 29, 2009, now Pat. No. 7,969,213.

(30) Foreign Application Priority Data

Dec. 23, 2008   (KR) .......................... 10-2008-0132096

(51) Int. Cl.
*H03L 7/06* (2006.01)

(52) U.S. Cl. ........................................ 327/158; 327/149

(58) Field of Classification Search .................. 327/149, 327/158

See application file for complete search history.

(56) References Cited

U.S. PATENT DOCUMENTS

| | | | | |
|---|---|---|---|---|
| 6,525,581 B1* | 2/2003 | Choi | ............................... | 327/175 |
| 6,853,225 B2* | 2/2005 | Lee | ................................. | 327/158 |
| 6,963,235 B2* | 11/2005 | Lee | ................................. | 327/158 |
| 7,282,978 B2* | 10/2007 | Lee | ................................. | 327/175 |
| 7,358,784 B2* | 4/2008 | Kim et al. | ....................... | 327/158 |
| 7,363,563 B1* | 4/2008 | Hissen et al. | ................... | 714/733 |
| 7,428,286 B2* | 9/2008 | Kim | ................................. | 375/371 |
| 7,560,963 B2* | 7/2009 | Yun et al. | ....................... | 327/158 |
| 7,609,583 B2* | 10/2009 | Booth et al. | ................... | 365/233.1 |
| 7,612,620 B2* | 11/2009 | Rausch et al. | ................... | 331/45 |
| 7,629,829 B2* | 12/2009 | Lee | ................................. | 327/298 |
| 7,733,141 B2* | 6/2010 | Oh | ................................. | 327/158 |
| 2007/0069781 A1* | 3/2007 | Kim et al. | ....................... | 327/158 |
| 2007/0194821 A1* | 8/2007 | Gomm et al. | ................... | 327/158 |
| 2008/0042705 A1* | 2/2008 | Kim et al. | ....................... | 327/158 |
| 2009/0002042 A1* | 1/2009 | Rausch et al. | ................... | 327/175 |
| 2009/0231006 A1* | 9/2009 | Jang et al. | ....................... | 327/175 |
| 2010/0045353 A1* | 2/2010 | Booth et al. | ................... | 327/175 |
| 2010/0079182 A1* | 4/2010 | Lien et al. | ....................... | 327/175 |
| 2010/0097112 A1* | 4/2010 | Panditd et al. | ................... | 327/175 |
| 2010/0117702 A1* | 5/2010 | Jang et al. | ....................... | 327/175 |
| 2010/0156488 A1* | 6/2010 | Kim et al. | ....................... | 327/158 |
| 2010/0164566 A1* | 7/2010 | Ku | ................................. | 327/149 |

* cited by examiner

*Primary Examiner* — Lincoln Donovan
*Assistant Examiner* — Adam Houston
(74) *Attorney, Agent, or Firm* — IP & T Group LLP

(57) ABSTRACT

A delay locked loop (DLL) circuit includes a clock input buffer that generates a reference clock signal by buffering an external clock signal and outputs the reference clock signal by correcting a duty cycle of the reference clock signal in response to a duty cycle control signal. The DLL circuit also includes a timing compensation unit configured that generates a compensation reference clock signal by compensating for a toggle timing of the reference clock signal that is changed during the duty cycle correction operation in response to a timing control signal. The DLL circuit further includes and a duty cycle control unit that generates the duty cycle control signal and the timing control signal by detecting the duty cycle of the reference clock signal.

9 Claims, 6 Drawing Sheets

DLL CIRCUIT

CROSS-REFERENCES TO RELATED PATENT APPLICATION

This application is a division of U.S. patent application Ser. No. 12/431,875 filed on Apr. 29, 2009, now U.S. Pat. No. 7,969,213 which claims priority under 35 U.S.C. 119(a) of Korean application No. 10-2008-0132096, filed on Dec. 23, 2008. The disclosure of each of the foregoing applications is incorporated herein by reference in its entirety.

BACKGROUND

1. Technical Field

The embodiment described herein relates to a semiconductor integrated circuit (IC) and, more particularly, to a delay locked loop (DLL) circuit included in a semiconductor IC.

2. Related Art

A conventional semiconductor IC, such as an apparatus functioning as synchronous dynamic random access memory (SDRAM), has increased operational speed as a result of its use of clock signals. Such a semiconductor IC includes a clock buffer to buffer an external input clock signal. In some cases, the semiconductor IC uses a delay locked loop (DLL) circuit or a phase locked loop (PLL) circuit to generate for itself an internal clock signal with which the phase difference between the internal and the external clock signals is corrected. In the internal clock signal used in the semiconductor IC, the ratio of the time within a cycle in which a voltage is at "high" level and the time in which the voltage is at a "low" level interval, i.e., the "duty ratio," is typically set at 50:50. However, such semiconductor ICs often include numerous delay elements, as this can cause the duty ratio of the internal clock signal to vary.

Due to the high-speed operation of many present semiconductor ICs, the utilization of clock signals has increased, and thus, a clock signal having a relatively stable duty ratio is more critical. Accordingly, DLL circuits in semiconductor ICs have been built to include duty cycle correction units to stabilize the duty ratios of clock signals. The technology to correct duty cycles has become increasingly important for utilizing stable clock signals during the high speed operation of the semiconductor ICs.

DLL circuitry has been designed to correct the duty cycle of a reference clock signal that has been input into a delay line by imparting duty cycle correction functionality to a clock input buffer that generates the reference clock signal by buffering an external clock signal. Such DLL circuitry includes a duty cycle control unit for detecting the duty cycle of the reference clock signal and for controlling the duty cycle correction operation of the clock input buffer. The duty cycle control unit increases or decreases the high level interval of the reference clock cycle by adjusting the voltage level supplied to the clock input buffer.

However, although the duty ratio of the reference clock signal output from the clock input buffer is improved by the above-described operation, the toggle timing frequency of the reference clock signal changes. This phenomenon occurs because the rising edge and the falling edge of the reference clock signal are not fixed during the duty cycle correction operation of the clock input buffer. As a result, when the toggle timing of the reference clock signal varies, the amount of delay of the clock input buffer, which is modeled by a replica delayer, and the amount of the actual delay are different from each other, Thus, the precision deteriorates in the delay locking of the DLL circuit. As described above, although the DLL circuit has implemented technology to correct the duty cycle, the toggle timing frequency of the reference clock signal varies and reliability of the clock delay locking operation, a primary operation of the DLL circuit, deteriorates.

SUMMARY

Disclosed herein is a delay locked loop (DLL) circuit that performs a precise delay locking operation while performing a duty cycle correction operation.

In one aspect, a delay locked loop (DLL) circuit includes a clock input buffer configured to generate a reference clock signal by buffering an external clock signal and to output the reference clock signal by correcting a duty cycle of the reference clock signal in response to a duty cycle control signal; a timing compensation unit configured to generate a compensation reference clock signal by compensating for a toggle timing of the reference clock signal that is changed during a duty cycle correction operation in response to a timing control signal; and a duty cycle control unit configured to generate the duty cycle control signal and the timing control signal by detecting the duty cycle of the reference clock signal.

In another aspect, a delay locked loop (DLL) circuit includes a buffer configured to output a buffered clock signal by correcting a duty cycle of a clock signal; a timing compensation unit configured to impart a negative delay time to the buffered clock signal when a high level interval of the buffered clock signal is greater than a low level interval of the buffered clock signal and to impart a positive delay time to the buffered clock signal when the high level interval of the buffered clock signal is less than the low level interval of the buffered clock signal; and a duty cycle control unit configured to control the operations of the buffer and the timing compensation unit by detecting the duty cycle of the buffered clock signal.

In still another aspect, a delay locked loop (DLL) circuit includes a duty cycle correction unit configured to generate a correction rising clock signal and a correction falling clock signal by performing a duty cycle correction operation on a rising clock signal and on a falling clock signal in response to a duty cycle control signal; a first timing compensation unit configured to compensate for a toggle timing of the correction rising clock signal that is changed during the duty cycle correction operation in response to a timing control signal; a second timing compensation unit configured to compensate for a toggle timing of the correction falling clock signal that is changed during the duty cycle correction operation in response to the timing control signal; and a duty cycle control unit configured to generate the duty cycle control signal and the timing control signal by detecting duty cycles of the correction rising clock signal and the correction cycle falling clock signal.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
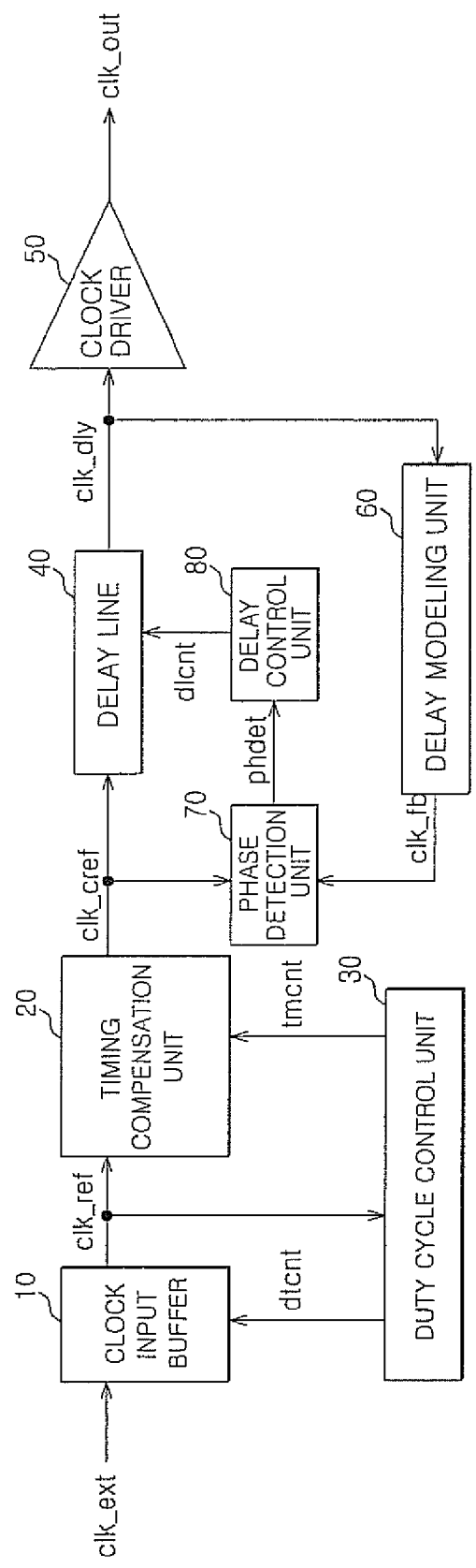
FIG. 1 is a schematic block diagram of an exemplary DLL circuit according to one embodiment.

FIG. 1 is a schematic block diagram of an exemplary DLL circuit according to one embodiment.

As shown in the figure, the DLL circuit according to one embodiment can include a clock input buffer 10, a timing compensation unit 20, a duty cycle control unit 30, a delay line 40, a clock driver 50, a delay modeling unit 60, a phase detection unit 70, and a delay control unit 80.

The clock input buffer 10 generates a reference clock signal 'clk_ref' by buffering an external clock signal 'clk_ext' and outputs the reference clock signal 'clk_ref' by correcting the duty cycle of the reference clock signal 'clk_ref' in response to a duty cycle control signal 'dtcnt'. The timing compensation unit 20 generates a compensation reference clock signal 'clk_ref' in response to a timing control signal 'tmcnt' by compensating for the toggle timing of the reference clock signal 'clk_ref', the toggle timing having changed during the duty cycle correction operation. The duty cycle control unit 30 generates the duty cycle control signal 'dtcnt' and the timing control signal 'tmcnt' upon detection of the duty cycle of the reference clock signal 'clk_ref'. The delay line 40 generates a delay clock signal 'clk_dly' by delaying the compensation reference clock signal 'clk_cref' in response to a delay control signal 'dlcnt'. The clock driver 50 generates an output clock signal 'clk_out' upon receipt of the delay clock signal 'clk_dly'. The delay modeling unit 60 generates a feedback clock signal 'clk_fb' by delaying the delay clock signal 'clk_dly' with a delay value determined by modeling the delay amount of the output path of the delay clock signal 'clk_dly'. The phase detection unit 70 generates a phase detection signal 'phdet' by comparing the phase of the feedback clock signal 'clk_fb' with the phase of the compensation reference clock signal 'clk_cref'. The delay control unit 80 generates the delay control signal 'dlcnt' in response to the phase detection signal 'phdet'.

Although in the present embodiment the external clock signal 'clk_ext' and the reference clock signal 'clk_ref' are represented as single-phase clock signals, they may alternatively be implemented in the form of a clock signal pair. Such form is included within the scope of the present invention.

The reference clock signal 'clk_ref' is a buffered clock signal generated by the clock input buffer 10 performing a buffering operation on the external clock signal 'clk_ext'. The reference clock signal 'clk_ref' is termed accordingly because it is a clock signal providing a reference when the phase detection unit 70 determines the phase of the feedback clock signal 'clk_fb'. Also, another clock signal is transmitted to the phase detection unit 70 from the timing compensation unit 20, and this clock signal is referred to as the compensation reference clock signal 'clk_cref' and not the reference clock signal 'clk_ref'.

The timing compensation unit 20 generates the compensation reference clock signal 'clk_cref' with the same phase as that of the reference clock signal 'clk_ref' when the high level interval and the low level interval of the reference clock signal 'clk_ref' have the same duration.

However, when the high level interval of the reference clock signal 'clk_ref' is greater than the low level interval, the timing compensation unit 20 generates the compensation reference clock signal 'clk_cref' with a phase earlier than that of the reference clock signal 'clk_ref' by imparting a negative delay time to the reference clock signal 'clk_ref'. In this case, since the phase of the reference clock signal 'clk_ref' is delayed while the clock input buffer 10 generates this reference clock signal by performing the duty cycle correction operation, the timing compensation unit 20 is performing this operation to correct the phase delay.

Further, when the high level interval of the reference clock signal 'clk_ref' is less than the low level interval, the timing compensation unit 20 generates the compensation reference clock signal 'clk_cref' with a phase later than that of the reference clock signal 'clk_ref' by imparting a positive delay time to the reference clock signal 'clk_ref'. In this case, since the phase of the reference clock signal 'clk_ref' is advanced while the clock input buffer 10 generates this reference clock signal by performing the duty cycle correction operation, the timing compensation unit 20 is performing this operation to correct the phase advance.

The duty cycle control unit 30 generates the duty cycle control signal 'dtcnt' and the timing control signal 'tmcnt' by detecting the duty cycle of the reference clock signal 'clk_ref'. The duty cycle control signal 'dtcnt' is implemented as a level signal and the timing control signal 'tmcnt' is implemented as a plurality of bits of digital code. That is, the duty cycle control unit 30 generates a plurality of bits of digital signal and outputs the digital signal as the timing control signal 'tmcnt' and adjust the voltage level of the duty cycle control signal 'dtcnt' in response to the logic value of the timing control signal 'tmcnt'.

As a result, the clock input buffer 10 performs a correction operation to change the length of the high level interval of the reference clock signal 'clk_ref' according to a successive change of the voltage level of the duty cycle control signal 'dtcnt'. The timing compensation unit 20 performs an operation to adjust the phase of the compensation reference clock signal 'clk_cref' according to a change of the logical value of the plurality of bits of the timing control signal 'tmcnt'.

The delay line 40, the delay modeling unit 60, the phase detection unit 70, and the delay control unit 80 constitute a feedback loop of a known DLL circuit and perform the operation to delay the compensation reference clock signal 'clk_cref' in order to control the phase of the output clock signal 'clk_out'.

Figure 2:
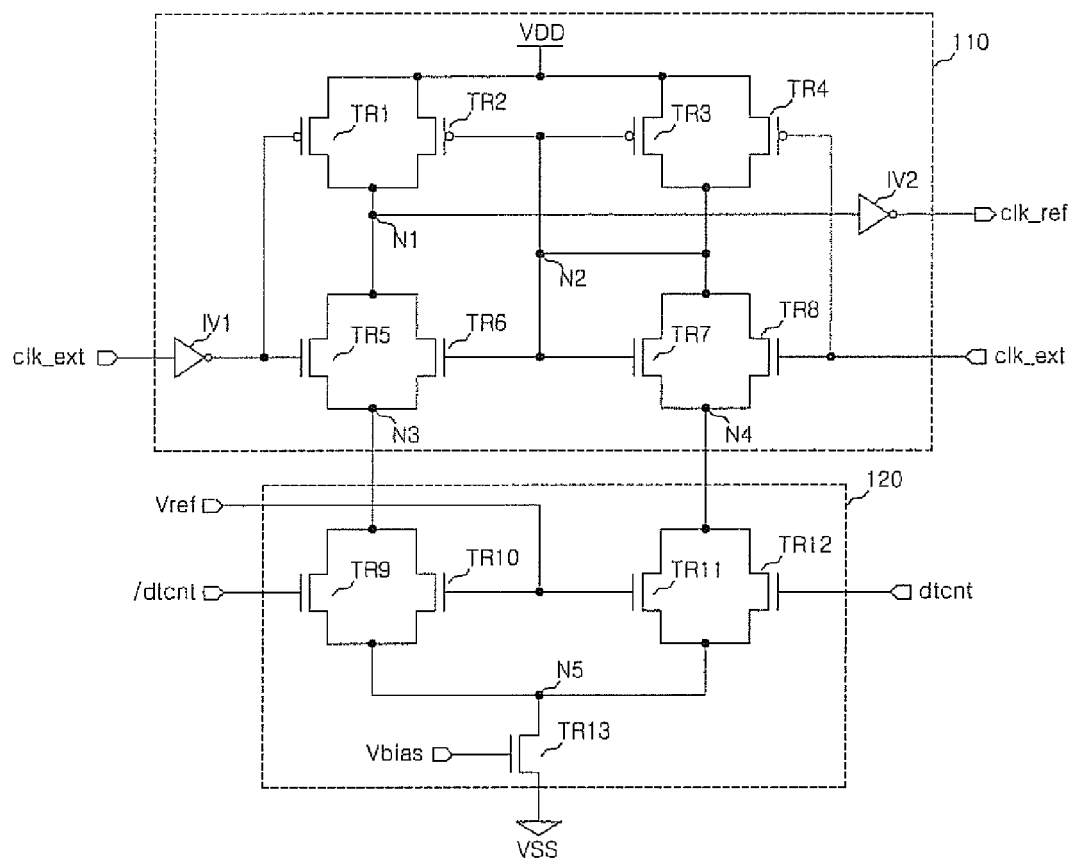
FIG. 2 is a configuration diagram of an exemplary clock input buffer of FIG. 1 according to one embodiment.

FIG. 2 is a configuration diagram of an exemplary clock input buffer 10 shown in FIG. 1 according to one embodiment. Herein, the duty cycle control signal 'dtcnt' is implemented as a signal pair 'dtcnt' and '/dtcnt' of which voltage levels are oppositely changed.

As shown in FIG. 2, the clock input unit 10 includes a buffering portion 110 and a duty cycle control portion 120.

The buffering portion 110 generates the reference clock signal 'clk_ref' by buffering the external clock signal 'clk_ext'. The duty cycle control portion 120 controls the duty cycle of the reference clock signal 'clk_ref' by controlling the operation of the buffering portion 110 in response to the duty cycle control signal pair 'dtcnt' and '/dtcnt'.

The buffering portion 110 includes first and second inverters IV1 and IV2 and first to eighth transistors TR1 to TR8.

The first inverter IV1 receives the external clock signal 'clk_ext'. The first transistor TR1 includes a gate that receives the output signal of the first inverter IV1, a source to which an external supply voltage VDD is applied, and a drain that is coupled with a first node N1. The second transistor TR2 includes a gate that is connected to a second node N2, a source to which the external supply voltage VDD is applied, and a drain that is coupled with the first node N1. The third transistor TR3 includes a gate and a drain that are coupled with the second node N2 and a source to which the external supply voltage VDD is applied. The fourth transistor TR4 includes a gate that receives the external clock signal 'clk_ext', a source to which the external supply voltage VDD is applied, and a drain that is coupled with the second node N2.

The fifth transistor TR5 includes a gate that receives the output signal of the first inverter IV1, a drain that is coupled with the first node N1, and a source that is coupled with a third node N3. The sixth transistor TR6 includes a gate that is coupled with the second node N2, a drain that is coupled with the first node N1, and a source that is coupled with the third node N3. The seventh transistor TR7 includes a gate and a drain that are coupled with the second node N2 and a source that is connected to a fourth node N4. The eighth transistor TR8 includes a gate that receives the external clock signal 'clk_ext', a drain that is coupled with the second node N2, and a source that is coupled with the fourth node N4. The second inverter IV2 receives a voltage applied to the first node N1 and outputs the reference clock signal 'clk_ref'.

The duty cycle control portion 120 includes ninth to thirteenth transistors TR9 to TR13.

The ninth transistor TR9 includes a gate that receives a negative duty cycle control signal '/dtcnt', a drain that is coupled with the third node N3, and a source that is coupled with a fifth node N5. The tenth transistor TR10 includes a gate to which a reference voltage 'Vref' is applied, a drain that is coupled with the third node N3, and a source that is coupled with the fifth node N5. The eleventh transistor TR11 includes a gate to which the reference voltage 'Vref' is applied, a drain that is coupled with the fourth node N4, and a source that is coupled with the fifth node N5. The twelfth transistor TR12 includes a gate that receives a positive duty cycle control signal 'dtcnt', a drain that is coupled with the fourth node N4, and a source that is coupled with the fifth node N5. The thirteenth transistor TR13 includes a gate to which a bias voltage 'Vbias' is applied, a drain that is coupled with the fifth node N5, and a grounded source VSS.

The reference voltage 'Vref' in this embodiment, which is used to provide a predetermined reference level in the semiconductor integrated circuit (IC), is generated for example through a band-gap circuit.

The voltage level of the positive duty cycle control signal 'dtcnt' increases when the high level interval of the reference clock signal 'clk_ref' is greater than the low level interval and decreases when the high level interval of the reference clock signal 'clk_ref' is less than the low level interval. The negative duty cycle control signal '/dtcnt' has a polarity that is opposite to that of the positive duty cycle control signal 'dtcnt'.

When the voltage level of the positive duty cycle control signal 'dtcnt' increases, the current flowing through the twelfth transistor TR12 increases such that the voltage level at the second node N2 decreases. Therefore, the voltage level of the first node N1 increases. Accordingly, the high level interval of the clock signal applied to the first node N1 increases as a result of the buffering operation of the buffering portion 110 with respect to the external clock signal 'clk_ext'. Thus, the high level interval of the reference clock signal 'clk_ref' decreases.

On the contrary, when a voltage level of the negative duty cycle control signal '/dtcnt' increases, the current flowing through the ninth transistor TR9 increase, such that the voltage level of the first node N1 decreases. Accordingly, the low level interval of the clock signal applied to the first node N1 increases as a result of the buffering operation of the buffering portion 110 Thus, the low level interval of the reference clock signal 'clk_ref' increases.

Figure 3:
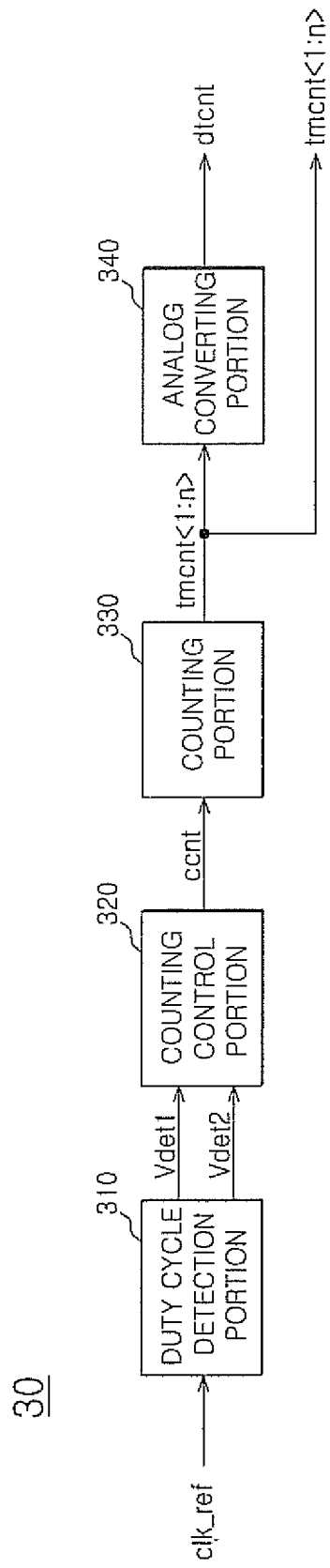
FIG. 3 is a configuration diagram of an exemplary duty cycle control unit shown FIG. 1 according to one embodiment.

FIG. 3 is a configuration diagram of an exemplary duty cycle control unit shown FIG. 1 according to one embodiment. The timing control signal 'tmcnt' is represented as an n-bit digital signal 'tmcnt<1:n>'.

As shown in the figure, the duty cycle control unit 30 can include a duty cycle detection portion 310, a counting control portion 320, a counting portion 330, and an analog converting portion 340.

The duty cycle detection portion 310 generates a first detection voltage 'Vdet1' and a second detection voltage 'Vdet2' by determining the duty cycle of the reference clock signal 'clk_ref'. The duty cycle detection portion 310 increases the voltage level of the first detection voltage 'Vdet1' and decreases the voltage level of the second detection voltage 'Vdet2' when the high level interval of the reference clock signal 'clk_ref' is greater than the low level interval. Likewise, the duty cycle detection portion 310 decreases the voltage level of the first detection voltage 'Vdet1' and increases the voltage level of the second detection voltage 'Vdet2' when the high level interval of the reference clock signal 'clk_ref' is fess than the low level interval of the reference clock signal 'clk_ref'. The duty cycle detection portion 310 that operates in such a manner can easily be implemented by using circuits such as a general duty accumulator that charges electric charges according to a duty cycle of the clock signal.

The counting control portion 320 generates a counting control signal 'ccnt' by comparing the first detection voltage 'Vdet1' to the second detection voltage 'Vdet2'. The counting control portion 320 can be implemented by using for example a general comparator circuit. That is, the counting control portion 320 compares the level of the first detection voltage 'Vdet1' to the level of the second detection voltage 'Vdet2' and generates the counting control signal 'ccnt' having a high-level or low-level voltage according to the comparison result.

The counting portion 330 generates the n-bit timing control signal 'tmcnt<1:n>' by performing a counting operation in response to the counting control signal 'ccnt'. The counting portion 330 can be implemented for example by using an up/down counter circuit that performs an up/down counting operation according to the level of the counting control signal 'ccnt'. The counting portion 330 may perform an operation to increase or decrease the number of bits having a logic value of '1' in the n-bit timing control signal 'tmcnt<1:n>'.

In some embodiments, the counting portion 330 is configured as a shift register that performs an operation to shift a cipher of one bit having the logic value of '1' included in the n-bit timing control signal 'tmcnt<1:n>'. Further, the counting portion 330 may be configured as a counter that increases or decreases a binary value of the n-bit timing control signal 'tmcnt<1:n>' by '1'. The above-mentioned configuration of the counting portion 330 can be implemented as known in the art and must be designed in conjunction with configurations of the analog converting portion 340 and the timing compensation unit 20.

The analog converting portion 340 generates the duty cycle control signal 'dtcnt' by converting the n-bit timing control signal 'tmcnt<1:n>' into a voltage level signal. The duty cycle control signal 'dtcnt' has a voltage level corresponding to the logic value of the n-bit timing control signal 'tmcnt<1:n>'. In the case when the duty cycle control signal is implemented as the signal pair 'dtcnt' and '/dtcnt', the difference between the positive duty cycle control signal 'dtcnt' and the negative duty cycle control signal '/dtcnt' increases or decreases depending on the logic value of the n-bit timing control signal 'tmcnt<1:n>'.

Figure 4:
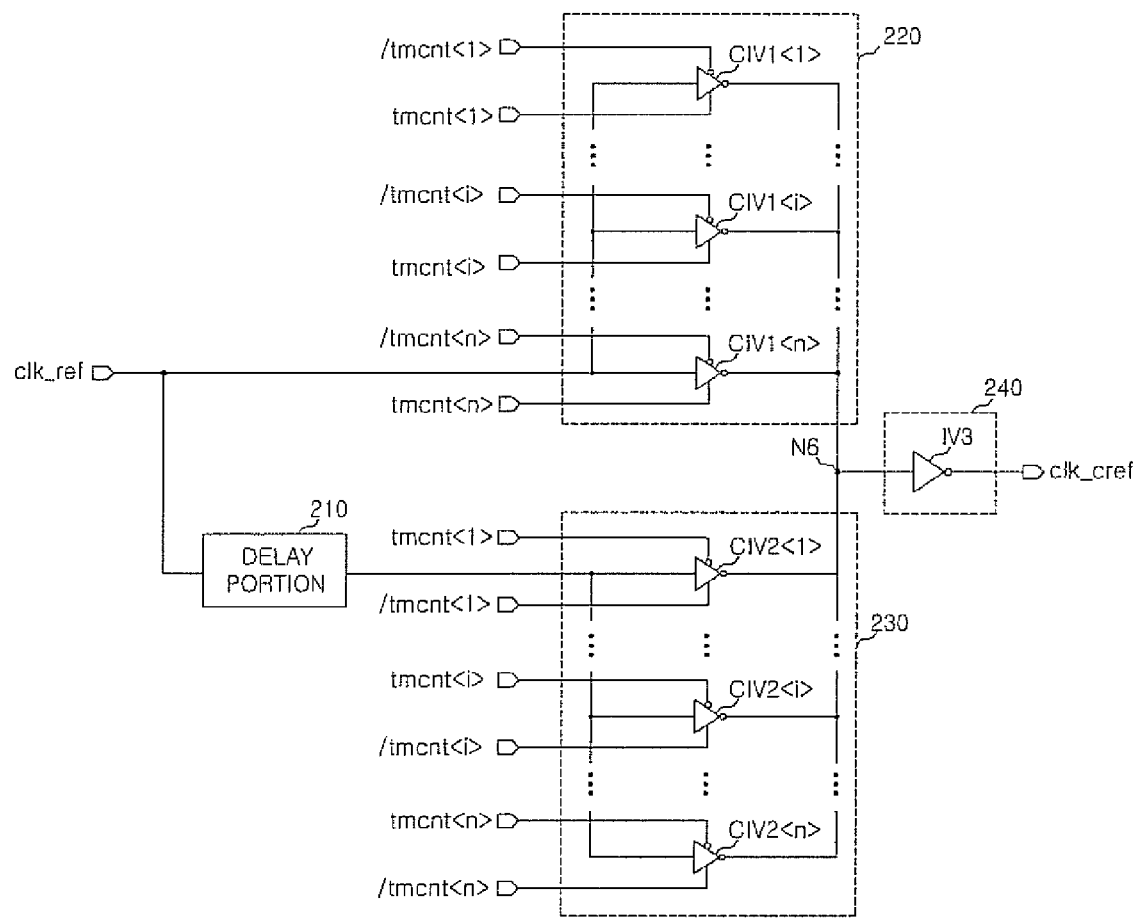
FIG. 4 is a configuration diagram of an exemplary timing compensation unit shown FIG. 1 according to one embodiment.

FIG. 4 is a configuration diagram of an exemplary timing compensation unit shown FIG. 1 according to one embodiment. Herein, the n-bit timing control signal is implemented in the form of the signal pair 'tmcnt<1:n>' and '/tmcnt<1:n>'.

As shown in the FIG. 4, the timing compensation unit 20 can include a delay portion 210, a first driving portion 220, a second driving portion 230, and a third driving portion 240.

The delay portion 210 delays the reference clock signal 'clk_ref' for a predetermined time.

The first driving portion 220 receives the reference clock signal 'clk_ref' and transmits the clock signal to the sixth node N6 in response to the n-bit timing control signal pair 'tmcnt<1:n>' and '/tmcnt<1:n>'. The first driving portion 220 includes n control inverters 'CIV1<1:n>' that are turned on or off in response to each 1 bit of the timing control signal pair 'tmcnt<1:n>' and '/tmcnt<1:n>'.

The second driving portion 230 receives an output clock signal from the delay portion 210 and transmits the clock signal to the sixth node N6 in response to the n-bit timing control signal pair 'tmcnt<1:n>' and '/tmcnt<1:n>'. The second driving portion 230 includes n control inverters 'CIV2<1:n>'. The control inverters 'CIV2<1:n>' of the second driving portion 230 receive the timing control signal pair 'tmcnt<1:n>' and '/tmcnt<1:n>' in a fashion to have a polarity opposite to that provided to the control inverters 'CIV1<1:n>' of the first driving portion 220.

The third driving portion 240 receives clock signals transmitted to the sixth node N6 and outputs the clock signals as the compensation reference clock signal 'clk_cref'. The third driving portion 230 includes an inverter IV3 as shown in the FIG. 4.

In this embodiment the n-bit timing control signal 'tmcnt<1:n>' is implemented such that the number of bits having the logic value of '1' among n bits varies. In addition, the first to i-th bits have the logic value of '1' in the case of the n-bit timing control signal 'tmcnt<1:n>'. Therefore, i control inverters 'CIV1<1:i>' will be turned on at the first driving portion 220 and n-i control inverters 'CIV2<i+1:n>' will be turned on at the second driving portion 230.

Assuming that the compensation value of the timing compensation unit 20 at this time is equal to a default value, the compensation reference clock signal 'clk_cref' has the same phase as the reference clock signal 'clk_ref'. However, when the number of bits having the logic value of '1', which are included in the n-bit timing control signal 'tmcnt<1:n>' increases, the phase of the compensation reference clock signal 'clk_cref' leads the phase of the reference clock signal 'clk_ref'. Conversely, when the number of bits having the logic value of '1', which are included in the n-bit timing control signal 'tmcnt<1:n>', decreases, the phase of the compensation reference clock signal 'clk_cref' lags behind the phase of the reference clock signal 'clk_ref'.

As such, the timing compensation unit 20 can be implemented as a phase mixer type. Herein, it is assumed that all the control inverters of the timing compensation unit 20 have the same driving ability. When instead a weighted value is applied to the driving ability of each control inverter, the timing control signal 'tmcnt<1:n>' includes one bit having the logic value of '1' and changes the cipher of the bit. Also, the timing control signal 'tmcnt<1:n>' can be implemented by increasing or decreasing the binary logic value by '1'.

The configuration of the timing compensation unit 20 is not limited to the phase mixer type. That is, the timing compensation unit 20 may be implemented by using a combination of transistors that are connected in series and the implementation may include resistor elements. In either of these cases, each of the transistors varies the delay amount of the reference clock signal 'clk_ref' in response to each bit of the timing control signal 'tmcnt<1:n>'. Further, the timing compensation unit 20 may be implemented by combinations of inverters, transistors, and resistor elements that are connected in parallel. In this implementation, the timing compensation units 20 have various types of circuit configurations that variably delay the reference clock signal 'clk_ref' in response to the n-bit timing control signal 'tmcnt<1:n>'.

Figure 5:
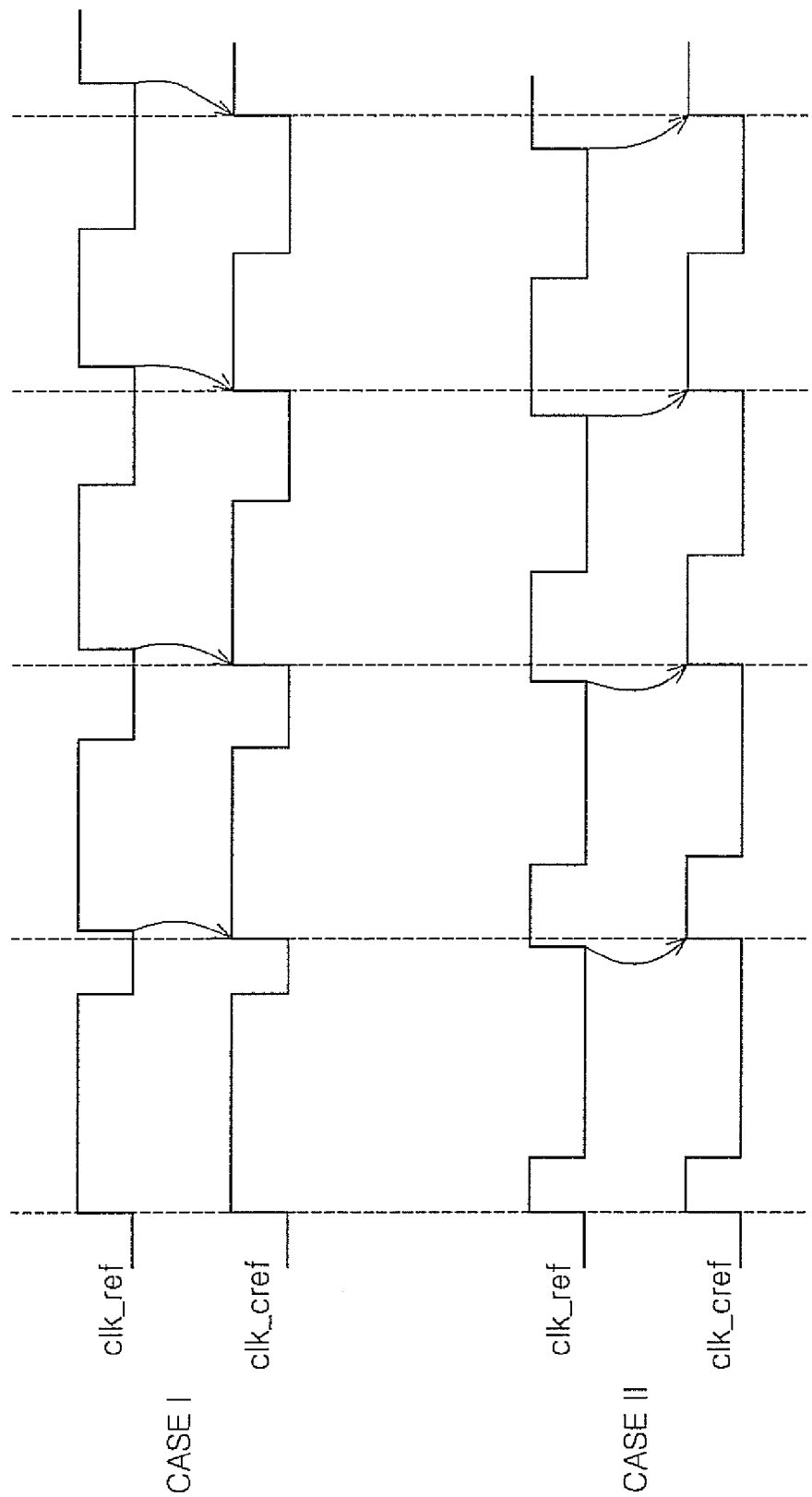
FIG. 5 is a timing diagram for illustrating an operation of the DLL circuit of FIG. 1.

FIG. 5 is a timing diagram for illustrating an operation of the DLL circuit of FIG. 1 according to one embodiment.

In this FIG. 5, there are shown waveforms of the reference clock signal 'clk_ref' and the compensation reference clock signal 'clk_cref' of a case (CASE I) in which the high level interval of the reference clock 'clk_ref' is greater than the low level interval of the reference clock signal 'clk_ref' and a case (CASE II) in which the high level interval of the reference clock 'clk_ref' is less than the low level interval of the reference clock signal 'clk_ref'.

In the first case (CASE I), the duty cycle of the reference clock signal 'clk_ref' is gradually corrected by the duty cycle correction operation of the clock input buffer 10. However, as shown in the figure, the phase of the reference clock signal 'clk_ref' is increasingly delayed. In response, the timing compensation unit 20 generates the compensation reference clock signal 'clk_cref' by advancing the phase of the reference clock signal 'clk_ref' to compensate for the phase of the reference clock signal 'clk_ref' being shifted by the duty cycle correction operation.

In the second case (CASE II), the duty cycle of the reference clock signal 'clk_ref' is gradually corrected by the duty cycle correction operation of the clock input buffer 10. However, as shown in the figure, the phase of the reference clock signal 'clk_ref' is increasingly advanced. In response, the timing compensation unit 20 generates the compensation reference clock signal 'clk_cref' by delaying the phase of the reference clock signal 'clk_ref' to compensate for the phase of the reference clock signal 'clk_ref' being shifted by the duty cycle correction operation.

Figure 6:
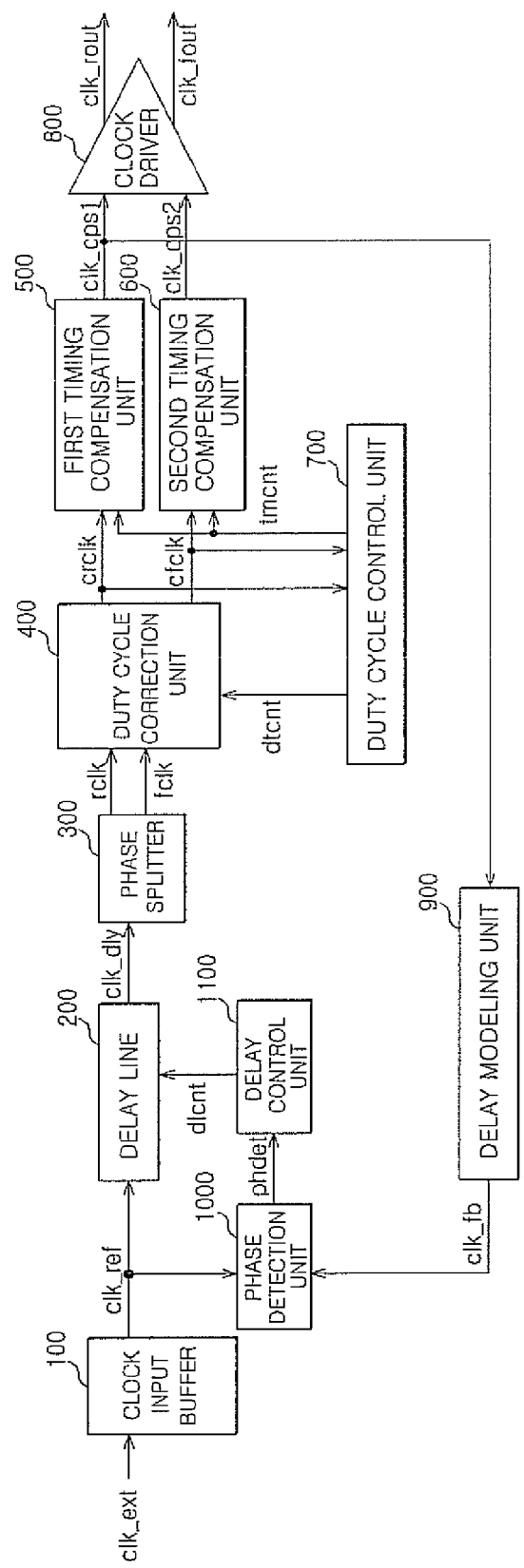
FIG. 6 is a schematic block diagram of a DLL circuit according to another exemplary embodiment.

FIG. 6 is a schematic block diagram of a DLL circuit according to another exemplary embodiment.

As shown in the FIG. 6, the DLL circuit includes a clock input buffer 100, a delay line 200, a phase splitter 300, a duty cycle correction unit 400, a first timing compensation unit 500, a second timing compensation unit 600, a duty cycle control unit 700, a clock driver 800, a delay modeling unit 900, a phase detection unit 1000, and a delay control unit 1100.

The clock input buffer 100 generates the reference clock signal 'clk_ref' by buffering the external clock signal 'clk_ext'. The delay line 200 generates a delay clock signal 'clk_dly' by delaying the reference clock signal 'clk_ref' in response to a delay control signal 'dlcnt'. The phase splitter 300 generates a rising clock signal 'rclk' and a falling clock signal 'fclk' by splitting a phase of the delay clock signal 'clk_dly'. The duty cycle correction unit 400 generates a correction rising clock signal 'crclk' and a correction falling clock signal 'cfclk' by performing a duty cycle correction operation for the rising clock signal 'rclk' and the falling clock signal 'fclk' in response to the duty cycle control signal 'dtcnt'. The first timing compensation unit 500 generates a first compensation clock signal 'clk_cps1' by compensating for a toggle timing of the correction rising clock signal 'crclk' changed during the duty cycle correction operation in response to a timing control signal 'tmcnt'. The second timing compensation unit 600 generates a second compensation clock signal 'clk_cps2' by compensating for a toggle timing of the correction falling clock signal 'cfclk' changed during the duty cycle correction operation in response to the timing control signal 'tmcnt'.

The duty cycle control unit 700 generates the duty cycle control signal 'dtcnt' and the timing control signal 'tmcnt' by detecting the duty cycles of the correction rising clock signal 'crclk' and the correction falling clock signal 'cfclk'. The clock driver 800 generates a rising output clock signal 'clk_rout' and a falling output clock signal 'clk_fout' by driving the first compensation clock signal 'clk_cps1' and the second compensation clock signal 'clk_cps2'. The delay modeling unit 900 generates a feedback clock signal 'clk_fb' by delaying the first compensation clock signal 'clk_cps1' with a delay value acquired by modeling a delay amount of an output path of the first compensation clock signal 'clk_cps1'. The phase detection unit 1000 generates a phase detection signal 'phdet' by comparing the phase of the feedback clock signal 'clk_fb' with the phase of the reference clock signal 'clk_ref'. The delay control unit 1100 generates the delay control signal 'dlcnt' in response to the phase detection signal 'phdet'.

In this embodiment, the duty cycle correction unit 400 can be implemented similarly to the clock input buffer 100. The duty cycle correction unit 400 is configured to output a clock signal pair by receiving and buffering the clock signal pair. As such, the buffered clock signals output from the duty cycle correction unit 400 configured as the buffer are the correction rising clock signal 'crclk' and the correction falling clock signal 'cfclk'.

The duty cycle control unit 700 differs from the duty cycle control unit 30 of the embodiment of FIG. 1 in that a clock signal pair is inputted, but it can be appreciated by those skilled in the art that the duty cycle control unit 700 is configured to receive the clock signal pair instead of the single-phase clock signal. Otherwise the form of the input signal of the present embodiment is similar to that of the other embodiment.

Further, the first timing compensation unit 500 and the second timing compensation unit 600 can be implemented in a form similar to that of the timing compensation unit 20 of FIG. 1.

That is, the DLL circuit includes the duty cycle correction unit 400, the first timing compensation unit 500, the second timing compensation unit 600, and the duty cycle control unit 700 subsequent to the delay line 200 with respect to signal flow. The DLL circuit performs a precision delay locking operation through such an arrangement. Also, an output clock signal is generated such that it has an improved duty ratio characteristic and a precisely adjusted phase. This is achieved by performing the duty cycle correction operation and the timing compensation operation using the clock signal pair phase-split by the phase splitter 300, that is, the rising clock signal 'rclk' and the falling clock signal 'fclk'.

As described above, a DLL circuit can perform a more precise delay locking operation by compensating for the timing of a clock signal, which varies when performing a duty cycle correction operation using a clock input buffer or a buffer-type duty cycle correction unit. Accordingly, it is possible to improve operational reliability of the DLL circuit and to more stably support data input and output operations of a semiconductor IC.

While certain embodiments have been described above, it will be understood to those skilled in the art that the embodiments described are by way of example only. Accordingly, the apparatus described herein should not be limited based on the described embodiments. Rather, the apparatus described herein should only be limited in light of the claims that follow when taken in conjunction with the above description and accompanying drawings.

What is claimed is:

1. A delay locked loop circuit comprising:
   a duty cycle correction unit configured to generate a correction rising clock signal and a correction falling clock signal by performing a duty cycle correction operation on a rising clock signal and on a falling clock signal in response to a duty cycle control signal;
   a first timing compensation unit configured to compensate for a toggle timing of the correction rising clock signal that is changed during the duty cycle correction operation in response to a timing control signal;
   a second timing compensation unit configured to compensate for a toggle timing of the correction falling clock signal that is changed during the duty cycle correction operation in response to the timing control signal; and
   a duty cycle control unit configured to generate the duty cycle control signal and the timing control signal by detecting duty cycles of the correction rising clock signal and the correction falling clock signal.

2. The DLL circuit of claim 1, wherein the duty cycle correction unit includes:
   a buffering portion configured to generate the correction rising clock signal and the correction falling clock signal by buffering the rising clock signal and the falling clock signal; and
   a duty cycle control portion configured to control the duty cycles of the correction rising clock signal and the correction falling clock signal by controlling the operation of the buffering portion in response to the duty cycle control signal.

3. The DLL circuit of claim 1, wherein the first timing compensation unit is configured to generate a clock signal having a phase that leads a phase of the correction rising clock signal by imparting a negative delay time to the correction rising clock signal when the high level interval of the correction rising clock signal is greater than the low level interval of the correction rising clock signal and to generate a clock signal having a phase that lags behind a phase of the correction rising clock signal by imparting a positive delay time to the correction rising clock signal when the high level interval of the correction rising clock signal is less than the low level interval of the correction rising clock signal.

4. The DLL circuit of claim 3, wherein the first timing compensation unit includes:
   a delay portion configured to delay the correction rising clock signal for a predetermined time;
   a first driving portion configured to receive the correction rising clock signal and to transmit the correction rising clock signal to a first node in response to the timing control signal;
   a second driving portion configured to receive an output clock signal from the delay portion and to transmit the output clock signal to the first node in response to the timing control signal; and
   a third driving portion configured to receive and to output the correction rising clock signal and the output clock signal that are transmitted to the first node.

5. The DLL circuit of claim 1, wherein the second timing compensation unit is configured to generate a clock signal having a phase that leads the phase of the correction falling clock signal by imparting a negative delay time to the correction falling clock signal when the high level interval of the correction falling clock signal is greater than the low level interval of the correction falling clock signal and to generate a clock signal having a phase that lags behind a phase of the correction falling clock signal by imparting a the positive delay time to the correction falling clock signal when the high level interval of the correction falling clock signal is less than the low level interval of the correction falling clock signal.

6. The DLL circuit of claim 5, wherein the second timing compensation unit includes:
 a delay portion configured to delay the correction falling clock signal for a predetermined time;
 a first driving portion configured to receive the correction falling clock signal and to transmit the correction falling clock signal to a first node in response to the timing control signal;
 a second driving portion configured to receive an output clock signal from the delay portion and to transmit the output clock signal to the first node in response to the timing control signal; and
 a third driving portion configured to receive and output the correction falling clock signal and the output clock signal that are transmitted to the first node.

7. The DLL circuit of claim 1, wherein the duty cycle control unit is configured to generate a plurality of bits as a digital signal and to output the digital signal as the timing control signal by detecting duty cycles of the correction rising clock signal and the correction falling clock signal and to adjust a voltage level of the duty cycle control signal in response to a logic value of the timing control signal.

8. The DLL circuit of claim 7, wherein the duty cycle control unit includes:
 a duty cycle detection portion configured to generate a first detection voltage and a second detection voltage by detecting the duty cycles of the correction rising clock signal and the correction falling clock signal;
 a counting control portion configured to generate a counting control signal by comparing the first detection voltage and the second detection voltage;
 a counting portion configured to generate the timing control signal by performing a counting operation in response to the counting control signal; and
 an analog converting portion configured to generate the duty cycle control signal by converting the timing control signal into a voltage level signal.

9. The DLL circuit of claim 1, further comprising:
 a delay line configured to generate a delay clock signal by delaying a reference clock signal in response to a delay control signal;
 a phase splitter configured to generate the rising clock signal and the falling clock signal by splitting a phase of the delay clock signal;
 a delay modeling unit configured to generate a feedback clock signal by delaying an output clock signal of the first timing compensation unit with a delay value acquired by modeling a delay amount of an output path of the output clock signal of the first timing compensation unit;
 a phase detection unit configured to generate a phase detection signal by comparing a phase of the feedback clock signal with a phase of the reference clock signal; and
 a delay control unit configured to generate the delay control signal in response to the phase detection signal.

* * * * *